United States Patent
Sathyamurthy et al.

(10) Patent No.: US 8,428,671 B2
(45) Date of Patent: Apr. 23, 2013

(54) THICK OXIDE FILM BY SINGLE COATING

(75) Inventors: Srivatsan Sathyamurthy, Waltham, MA (US); Martin W. Rupich, Framingham, MA (US)

(73) Assignee: American Superconductor Corporation, Devens, MA (US)

( * ) Notice: Subject to any disclaimer, the term of this patent is extended or adjusted under 35 U.S.C. 154(b) by 481 days.

(21) Appl. No.: 12/751,064

(22) Filed: Mar. 31, 2010

(65) Prior Publication Data

US 2011/0245083 A1     Oct. 6, 2011

(51) Int. Cl.
*H01B 12/00*     (2006.01)

(52) U.S. Cl.
USPC .......................................................... 505/230

(58) Field of Classification Search .......... 505/230–237, 505/430–447
See application file for complete search history.

(56) References Cited

U.S. PATENT DOCUMENTS

| | | | |
|---|---|---|---|
| 6,669,774 B1 | 12/2003 | Zhang et al. | |
| 6,797,313 B2 | 9/2004 | Fritzemeier et al. | |
| 7,326,434 B2 | 2/2008 | Rupich et al. | |
| 2003/0050195 A1* | 3/2003 | Wiesmann et al. | 505/100 |
| 2004/0171494 A1 | 9/2004 | Seleznev et al. | |
| 2005/0159298 A1 | 7/2005 | Rupich et al. | |
| 2009/0247413 A1* | 10/2009 | Hayashi et al. | 505/237 |

OTHER PUBLICATIONS

Smith, et al. "High Critical Current Density Thick MOD-Derived YBCO Films" *IEEE Transactions on Applied Superconductivity*. vol. 9, No. 2. Jun. 1999 (pp. 1531-1534).

Ron Feenstra, et al. "A Modular Ex Situ Conversion Process for Thick MOD-Flouride RBCO Precursors" *IEEE Transactions on Applied Superconductivity, IEEE Service Center, Los Alamitos, CA*. vol. 19, No. 3 (Jun. 1, 2009) pp. 3131-3135.

Solovyov Vyacheslav, et al. "Kinetics of YBa2Cu3O7 film growth by postdeposition processing" *Applied Physics Letters, AIP, American Institute of Physics*. vol. 76, No. 14 (Apr. 3, 2000) pp. 1911-1913.

* cited by examiner

*Primary Examiner* — Colleen Dunn
(74) *Attorney, Agent, or Firm* — Occhiuti Rohlicek & Tsao LLP (57) ABSTRACT

An article including a substrate and a layer of a homogeneous metal-oxyfluoride intermediate film disposed on the substrate, the intermediate film containing a rare earth metal, an alkaline earth metal, and a transition metal. The intermediate film has a defect density less than 20 percent and, upon thermal treatment, is capable of converting to a homogeneous rare earth metal-alkaline earth metal-transition metal-oxide superconductor film with a stoichiometric thickness greater than 1 μm and up to 5 μm. Also disclosed is another article including a substrate and the homogeneous superconductor film with a stoichiometric thickness greater than 1 μm and up to 5 μm. Further, methods of making these two articles are described.

14 Claims, 4 Drawing Sheets

THICK OXIDE FILM BY SINGLE COATING

GOVERNMENTAL RIGHTS

This invention was made with government support under project number FA9550-07-C-0034 awarded by the Air Force Office of Scientific Research. The government has certain rights in the invention.

BACKGROUND

High-temperature superconducting (HTS) materials, such as yttrium-barium-copper-oxide (YBCO), have been used to make thin film superconductor devices and wires. Thick (i.e., >1 µm) HTS films, having a higher critical current ($I_c$), are preferred in applications requiring high current carrying capability, e.g., power transmission and distribution lines, transformers, fault current limiters, magnets, motors, and generators. With conventional solution-based techniques, thicker superconducting films are formed of multiple layers of HTS thin films, each having a thickness no greater than 1 µm.

Superconducting thin films may be deposited on buffered or unbuffered substrates by a variety of techniques including decomposition of trifluoroacetate-based metal organic precursors. Precursor decomposition is the slowest and most critical step in the manufacturing of HTS thin films. When a precursor film undergoes decomposition, a significant volume change occurs, generating stresses within the film. If uncontrolled, these stresses can cause extensive cracking in the resulting intermediate film, which in turn leads to failure of forming a HTS coating with a high $I_c$. Thus, it is important to accommodate these stresses. One way to achieve this is control the decomposition rates of different precursors by careful selection of, e.g., decomposition temperature, linespeed, gas flow rate, and gas composition. See U.S. Pat. Nos. 6,669,774 and 6,797,313.

As it requires multiple coating and decomposition steps to produce a thick HTS film formed of multiple layers, it is difficult to greatly reduce the processing time without compromising the quality of HTS film, e.g., an $I_c$ drop. Thus, there is a need to develop new methods for making thick films formed of a single layer of HTS materials.

SUMMARY

Accordingly, one general aspect of this invention relates to a solution-based method of making a thick film of an oxide, in particular an earth-alkaline earth-transition metal oxide (e.g., YBCO compounds such as $YBa_2Cu_3O_{7-x}$), via a single-coating step. This method includes: disposing a solution on a surface of a substrate to form a precursor film, the solution including a first salt of a rare earth metal, a second salt of an alkaline earth metal, and a third salt of a transition metal, at least one of the first and second salts being a fluorinated carboxylate salt (e.g., a trifluoroacetate salt); and heating the precursor film at a first temperature suitable for decomposing the third salt in a first environment having a first water vapor pressure of 10-30 Torr, and then at a second temperature suitable for decomposing the first and second salts in a second environment having a second water vapor pressure of 10-60 Torr, the second water vapor pressure being not lower than the first water vapor pressure, thereby forming a layer of a metal-oxyfluoride intermediate film. Via this method, the layer of the intermediate film thus formed has a defect density less than 20 percent (e.g., less than 10 percent, less than 5 percent, or less 1 percent). The intermediate can be, for example, partially or completely formed of one or more metal oxyfluoride compounds.

As used herein, a "defect" refers to a crack or a blister detectable by visual or optical inspection. The term "defect density" refers to the area percentage of defects contained within any given area of the topmost surface of the intermediate film. The term "defect size" refers to the maximum dimension of a defect appearing in the intermediate layer. As used herein, the term "a" or "an" refers to one or more. For example, a first salt of a rare earth metal can be $Y(OOCCF_3)_3$, or a combination of $Y(OOCCF_3)_3$ and $Y(OOCCH_3)_3$, or a combination of $Y(OOCCF_3)_3$ and $Dy(OOCCH_3)_3$. As another example, the term "a first temperature" refers to both a temperature point and a range of temperatures.

Embodiments of this method may include one or more of the following features.

The first temperature can be between 100° C. and 250° C. (e.g., between 150° C. and 250° C.). The second temperature can be between 250° C. and 350-600° C. (e.g., between 250° C. and 400-600° C.). The precursor film can be heated for less than 5 hours (e.g., less than 3 hours or less than 1 hour) to form the layer of the intermediate film. The layer of the intermediate film can be a single layer. The precursor film can be heated at the first temperature for a first duration and at the second temperature for a second duration, the ratio of the first to the second duration being between 0.5 and 3 (e.g., less than 2 or less than 1).

The method may further include heating the layer of the intermediate film at 700-850° C. (e.g., for less than 5 hours, 3 hours, or 1 hour) to form a layer of a rare earth metal-alkaline earth metal-transition metal-oxide film. The rare earth metal-alkaline earth metal-transition metal-oxide film can have a stoichiometric thickness greater than 1 µm and up to 5 µm. The rare earth metal-alkaline earth metal-transition metal-oxide film can be a single layer.

The rare earth metal can be Y, the alkaline earth metal can be Ba, and the transition metal can be Cu. The solution may further include a second rare earth or transition metal.

In another aspect, the invention features an article formed by the method described above. The article includes a substrate and a layer of a homogeneous metal-oxyfluoride intermediate film disposed on the substrate. The intermediate film contains a rare earth metal (e.g., Y), an alkaline earth metal (e.g., Ba), and a transition metal (e.g., Cu); and has a defect density less than 20 percent (e.g., less than 10 percent or less than 5 percent). The intermediate film may also have a defect size less than 500 µm (e.g., less than 200 micrometers, less than 100 micrometers, or less than 50 micrometers). In particular, upon thermal treatment, the intermediate film is capable of converting to a homogeneous rare earth metal-alkaline earth metal-transition metal-oxide superconductor film with a stoichiometric thickness greater than 1 µm and up to 5 µm (e.g., between 1.2 µm and 3 µm).

The metal-oxyfluoride intermediate film is typically 2-4 times thicker than the superconductor film converted from the intermediate film by thermal treatment. For instance, in order to make a 2 µm thick superconductor film, the intermediate film must have a thickness of at least 4 µm. As mentioned above, such thick intermediate films are traditionally made by repeatedly coating one intermediate layer on top of another. Compared to the multi-layer intermediate film produced via the traditional solution-based techniques, the single-coat intermediate film made by the method of this invention does not contain any interruptive interface between the individual layers. More specifically, throughout the film's thickness, the constituent elements of the film have substantially identical concentrations or continuously varying concentrations (i.e., either increasing or decreasing from one surface of the intermediate film to the opposing surface). As a consequence, the superconductor film converted from this homogeneous intermediate film has a substantially identical crystallographic texture and/or critical current density throughout its thickness. The term "homogeneous" refers to this interface-free characteristic of the intermediate film of the invention as well as the crystallographic texture/critical current density consistency of the superconductor film converted therefrom.

"Thermal treatment" as used herein refers to a process which uses an elevated temperature to affect a chemical change in the metal-oxyfluoride intermediate film so as to form an oxide film, e.g., an oxide superconductor film. Preferably, thermal treatment occurs in a controlled environment (e.g., controlled gas pressure, controlled gas environment, and/or controlled temperature).

The term "stoichiometric thickness" refers to the thickness of a theoretically fully-dense and stoichiometric oxide film (e.g., an oxide superconductor film). Accordingly, it cannot be greater than the actual or measured thickness of the film. For instance, the thick superconductor film produced via the method of this invention may contain a plurality of nanoparticles, serving as pinning centers dispersed within the superconductor film. In this scenario, the actual or measured thickness of the superconductor film is greater than its stoichiometric thickness. The stoichiometric thickness of an oxide film can be calculated based on the amount of constituent element, e.g., Ba in $YBa_2Cu_3O_{7-x}$, the film surface area, and the density of the pure oxide. See U.S. Pat. No. 6,797,313.

Embodiments of this article may include one or more of the following features.

The layer of the intermediate film can be a single layer. The intermediate film is, upon thermal treatment, capable of converting to a rare earth metal-alkaline earth metal-transition metal-oxide superconductor film (e.g., an YBCO film) having critical current density of 1 to 5 $MA/cm^2$ (e.g., 2.5 to 5 $MA/cm^2$). The intermediate film can further contain a second rare earth or transition metal which, upon thermal treatment of the intermediate film to form the superconductor film, is capable of forming a plurality of pinning centers dispersed within the superconductor film, the pinning centers being nanoparticles formed of the second rare earth metal. The substrate of the article can be metallic. The article can have a buffer layer between the substrate and the layer of the intermediate film.

Also within the scope of the invention is an article having a thick oxide superconductor layer made by the method described above. The article includes a substrate and, disposed thereon, a homogeneous film formed of a rare earth metal-alkaline earth metal-transition metal-oxide superconductor. The superconductor film has a stoichiometric thickness greater than 1 µm and up to 5 µm, a porosity of 5-20% (e.g., 15-20%), and a critical current density of 1 to 5 $MA/cm^2$. The superconductor film thus formed also has a laminar grain structure as opposed to a columnar grain structure observed in the film formed by pulsed laser deposition. The porosity is the volume percentage of the pores or voids in the superconductor film. The term "laminar grain structure" refers to a structure in which grain grows in a layered structure or substantially parallel to a substrate, as opposed to a columnar grain structure in which grains grow vertically with regard to a substrate.

Unless otherwise defined, all technical and scientific terms used herein have the same meaning as commonly understood by one of ordinary skill in the art to which this invention belongs. In case of conflict, the present specification, including definitions, will control.

The details of one or more embodiments are set forth in the accompanying description below. Other aspects, features, and advantages will be apparent from the following drawing, detailed description of embodiments, and also from the appending claims.

DETAILED DESCRIPTION

The invention is based, at least in part, on an unexpected finding that changing water vapor pressure during the process of converting a precursor film of an oxide superconductor to an intermediate film allows the formation of a homogeneous oxide superconductor film with a stoichiometric thickness >1 µm in a relatively short period of time. For example, the methods described herein can be used to prepare a superconductor intermediate (e.g., a metal oxyfluoride) in less than five hours (e.g., less than three hours or less than one hour). The resulting superconductor film has a relatively low defect density or a relatively high critical current density ($J_c$).

In general, a precursor film can be formed by disposing a precursor solution onto the surface of a layer of material (e.g., a substrate), with or without further processing (e.g., the precursor film can be formed of the same chemical components as the precursor solution). For example, a precursor film containing a salt of a rare earth metal, a salt of an alkaline earth metal, and a salt of a transition metal can be disposed onto the surface of a layer of material by, for example, dip coating, spin coating, slot coating, or web coating. In some embodiments, the method of disposing the precursor solution (e.g., spin coating) on the layer of material can convert the precursor solution into a precursor film, e.g., by at least partially removing the solvent(s) from the precursor solution, without additional processing.

Preferably, the precursor solution used to practice the method of this invention includes a first salt of a rare earth metal, a second salt of an alkaline earth metal, and a third salt of a transition metal, e.g., $Cu(O_2C_3H_5)_2$, at least one of the first and second salts being a trifluoroacetate salt. Other examples of precursor solutions and methods of making them are described in U.S. Pat. Nos. 7,326,434 and 6,669,774. The precursor solution may also include a salt of a second rare earth metal, e.g., $Dy(OOCCH_3)_3$, so that nanoparticles containing the second earth metal will form in the resulting superconductor serving as pinning centers. The first and second rare earth metal can be the same or different. The second rare earth metal can partially replace the first rare earth metal in the superconductor structure. In this case both the second and first rare earth metals can be found in both the superconductor and the nanoparticles pinning centers. More details about the formation of nanoparticles can be found in US Application Publication No. 2005/0159298.

The rare earth metal can be yttrium, lanthanum, europium, gadolinium, terbium, dysprosium, holmium, erbium, thulium, ytterbium, cerium, neodymium, promethium, samarium, or lutetium. In general, the rare earth metal salt can be any rare earth metal salt that is soluble in the solvent(s) contained in the precursor solution. One example is $Y(OOCCF_3)_3$. The alkaline earth metal can be barium, strontium, or calcium. Generally, the alkaline earth metal salt can be any alkaline earth metal salt that is soluble in the solvent(s) contained in the precursor solution, e.g., $Ba(OOCCF_3)_2$. The transition metal can be copper. The transition metal salt should be soluble in the solvent(s) contained in the precursor solution. Examples of such salts include copper trichloroacetate, copper tribromoacetate, copper triiodoacetate, $Cu(CH_3COCHCOCF_3)_2$, $Cu(OOCC_7H_{15})_2$, $Cu(CF_3COCHCOF_3)_2$, $Cu(CH_3COCHCOCH_3)_2$, $Cu(CH_3CH_2CO_2CHCOCH_3)_2$, $CuO(C_5H_6N)_2$ and $Cu_3O_3Ba_2(O-CH_2CF_3)_4$. In certain embodiments, the transition metal salt is a carboxylate salt, such as a propionate salt of the transition metal, e.g., a nonhalogenated propionate salt of the transition metal. An example of a nonhalogenated propionate salt of a transition metal is $Cu(O_2CC_2H_5)_2$.

In certain embodiments, the precursor solutions can have a relatively low total free acid concentration. In some embodiments, the precursor solutions have a total free acid concentration of less than about $1 \times 10^{-3}$ molar (e.g., less than about $1 \times 10^{-5}$ molar, about $1 \times 10^{-7}$ molar). Examples of free acids that can be contained in the precursor solutions include trifluoroacetic acid, carboxylic acids, and acetic acid.

The precursor solutions can have a relatively low water content. In certain embodiments, the precursor solutions have a water content of less than 10 volume percent (e.g., less than about 5 volume percent, less than 1 volume percent, or less than 0.5 volume percent).

The amount of the transition metal, alkaline earth metal and rare earth metal can be selected so that the ratio of the molar amount of each of these elements (e.g, in the ionic state) in the precursor solution is about 3:2:1 respectively.

In certain embodiments, the alkaline earth metal salt (e.g., barium salt) is the predominant (e.g., exclusive) source of the halogen (e.g., fluorine) used to form the alkaline earth metal halide when processing the precursor solution to form the intermediate (e.g., the metal oxyhalide intermediate). In other embodiments, such as when the rare earth metal salt undergoes decomposition at the same time as the alkaline earth metal salt, the rare earth salt can also supply halogen to the alkaline earth metal. In general, the precursor solutions can be prepared by combining the salts of the rare earth metal, the transition metal and the alkaline earth metal with the desired solvent(s) and optionally a carboxylic acid and/or water. In certain embodiments, the salts are combined so that the mole ratio of the transition metal salt:alkaline earth metal salt:rare earth metal salt in the precursor solution is about 3:2:1.

Subsequent to formation of the precursor solution, the solution can be disposed on the surface of an underlying layer (e.g., buffer layer, superconductor layer or substrate) to form a precursor film. Generally, the particular solvent(s) used, as well as the amount of the solvent(s) and/or water contained in the precursor solutions can be selected based upon the technique that will be used to dispose the precursor solution on the surface of the underlying layer. For example, if the solution will be dip coated, spin coated or web coated onto the surface of the underlying material layer, one or more alcohols (e.g., methanol, 2-methoxyethanol, butanol and/or isopropanol) can be used, and the amount of solvent(s) can be selected so that the desired viscosity and solids content is achieved. In embodiments in which the precursor solution is to be web coated on the underlying layer, it may be desirable for the precursor solution to have a kinematic viscosity of from about 1 centiStoke to about 10 centiStokes.

The foregoing treatments of a precursor solution can result in a metal oxyhalide intermediate. Preferably, the metal oxyhalide intermediate has a relatively low defect density. The metal oxyhalide intermediate can be further heated to form the desired superconductor layer. Typically, this step is performed by heating to a temperature of from about 700° C. to about 825° C. During this step, the nominal gas environment typically can contain from about 0.1 Torr to about 50 Torr oxygen and from about 0.1 Torr to about 150 Torr (e.g., about 12 Torr) of water vapor with the balance being nitrogen and/or argon.

Subsequent to being disposed on the surface of the underlying layer, the solution is treated to form a layer of superconductor material. This treatment generally involves heating at appropriate rates and in an appropriate gas environment so that during decomposition of the precursor solution to form the intermediate (e.g., a metal oxyhalide intermediate), minimal alkaline earth carbonate (e.g., $BaCO_3$) forms and minimal cross-linking occurs between discrete transition metal molecules (e.g., copper molecules). The intermediate (e.g., metal oxyhalide intermediate) is then further heated to form the desired superconductor material.

Decomposition of the precursor film is a very critical step in the manufacturing of oxide superconductor thin films. Certain superconductor precursor solutions can take a relatively long period of time to form a superconductor intermediate (e.g., a metal oxyfluoride intermediate) without the formation of a high volume fraction of defects. In some instances, trying to reduce this period of time can result in the intermediate having a density of defects such that further treatment to form a superconductor material results in a layer of superconductor material with a relatively low critical current density. For example, during the decomposition of the YBCO precursor solutions, two major events take place, which require different temperature ranges and length of time. The first event involves the decomposition of the copper precursor such as $Cu(O_2C_3H_5)_2$, at about 200-250° C., resulting in the formation of CuO. This event usually requires a slower rate of decomposition to reduce the likelihood of defect formation. The second event involves the decomposition of the yttrium and barium precursors such as $Y(OOCCF_3)_3$ and $Ba(OOCCF_3)_2$ (sometimes also the decomposition of a second rare earth metal precursor such as $Dy(OOCCH_3)_3$) at temperatures above 250° C., resulting in the formation of an oxyfluoride phase. The second event usually takes place at a faster rate than the first one.

The method of the invention includes, among others, applying different water vapor pressures to the two above-described events. In particular, the water vapor pressure applied in the second event is higher than that in the first event. In some embodiments, the precursor film is heated from an initial temperature (e.g., room temperature) to a temperature of from about 100° C. to about 250° C. at a rate of at least 5° C. per minute in a nominal gas environment having a first water vapor pressure of about from about 10 Torr to about 30 Torr (the total pressure being about 760 Torr with the balance being oxygen); next, the film is heated to a temperature of between 250° C. and 600° C. (e.g., 250-400° C.) at a rate of at least 2° C. per minute to form an intermediate in a nominal gas environment having a second water vapor pressure higher than the first water vapor pressure, e.g., about 10 Torr to about 60 Torr (the total pressure being about 760 Torr with the balance being oxygen).

The method of the invention includes, among others, varying the thermal treatment duration for the two above-described events. In particular, the duration for the first thermal treatment event (e.g., at a temperature range of 100-250° C.), t1, and that of the second thermal treatment event (e.g., at a temperature range 250° C.-400° C.), t2, could be varied. In some embodiments, the ratio t1/t2 is set not greater than 3 (e.g., less than 2 or less than 1).

The superconductor intermediate can then be heated to form a layer of the desired superconductor film. Typically, this step is performed by heating to a temperature of from about 700° C. to about 825° C. During this step, the nominal gas environment (of a total pressure of less than 760 Torr, e.g., less than 1 Torr) typically contains from about 0.1 Torr to about 50 Torr oxygen and from about 0.1 Torr to about 150 Torr (e.g., about 12 Torr) of water vapor with the balance being nitrogen and/or argon. Such methods are described in U.S. Pat. No. 6,669,774. Alternate embodiments are described in U.S. Pat. No. 5,231,074, PCT Publication No. WO 98/58415.

In particular embodiments, when preparing the superconductor material from the precursor solution, methods can be employed to minimize the formation of undesirable a-axis oriented oxide layer grains, by inhibiting the formation of the oxide layer until the required reaction conditions are attained. More details are provided in U.S. Pat. No. 6,673,387.

In some embodiments, preparation of a superconductor material can involve slot-die coating the precursor solution (e.g., onto a tape, such as a tape formed of a textured nickel tape having sequentially disposed thereon epitaxial buffer and/or cap layers, such as $Y_2O_3$, YSZ and $CeO_2$). The coated precursor film can deposited in an atmosphere containing $H_2O$ (e.g., from about 5 Torr $H_2O$ to about 15 Torr $H_2O$, from about 9 Torr $H_2O$ to about 13 Torr $H_2O$, about 11 Torr $H_2O$). The balance of the atmosphere can be an inert gas (e.g., nitrogen). The total pressure during film deposition can be, for example, about 760 Torr. The precursor film can be decomposed, for example, by transporting the coated tape through a tube furnace (e.g., a tube furnace having a diameter of about 2.5 inches) having a temperature gradient. The respective temperatures and gas atmospheres of the gradients in the furnace, as well as the transport rate of the sample through each gradient, can be selected so that the processing of the film is substantially the same as according to the above-noted methods.

Figure 1:
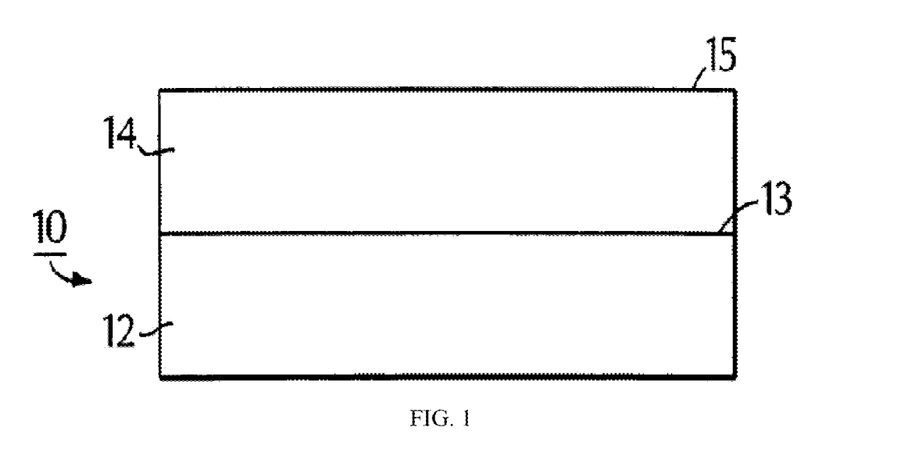
FIG. 1 is a cross-sectional view of one embodiment of the single coat article.

FIG. 1 shows a single coat superconductor article 10 according to one embodiment of the invention and prepared using the above-described methods and precursor solutions. Article 10 includes a substrate layer 12 with a surface 13 and a superconductor material layer 14 with a surface 15. Layer 14 is disposed on surface 13.

Layer 12 can be formed of any material capable of supporting layer 14. In certain embodiments, layer 12 can be a substrate. Preferably, the substrate should exhibit certain other properties other than supporting the superconductor layer. For example, the substrate should have a low Curie temperature so that the substrate is not ferromagnetic at the superconductor's application temperature. Furthermore, chemical species within the substrate should not be able to diffuse into the layer of superconductor material, and the coefficient of thermal expansion of the substrate should be about the same as the superconductor material. Moreover, the substrate material should be relatively resistant to oxidation under the processing conditions for forming the superconductor. Examples of substrate materials that can be used as layer 12 include, metals and/or alloys, such as nickel, silver, copper, zinc, aluminum, iron, chromium, vanadium, palladium, molybdenum and/or their alloys.

In certain embodiments, substrate 12 can be in the form of an object having a relatively large surface area (e.g., a tape or a wafer). In these embodiments, substrate 12 is preferably formed of a relatively flexible material (e.g., deformation textured nickel or a deformation textured nickel alloy).

Preferably, surface 13 of layer 12 has a relatively well defined crystallographic orientation. For example, surface 13 can be a biaxially textured surface (e.g., a (113)[211] surface) or a cube textured surface (e.g., a (100)[011] surface or a (100)[001] surface). Preferably, the peaks in an X-ray diffraction pole figure of surface 13 have a FWHM of less than about 20° (e.g., less than about 15°, less than about 10°, or from about 5° to about 10°).

Layer 14 can be prepared using the above-described methods. In preferred embodiments, layer 14 is well-ordered (e.g., biaxially textured or cube textured); is formed of a rare earth metal-barium-copper-oxide (REBCO), such as YBCO; includes pinning centers and/or has a stoichiometric thickness of from 1.2 micron to about 5 microns.

In still preferred embodiments, layer 14 is homogeneous and has a relatively high critical current density, e.g., at least about $1 \times 10^6$ Amperes per square centimeter (or at least about $2 \times 10^6$ Amperes per square centimeter), as determined by transport measurement at 77K in self field (i.e., no applied field) using a 1 microVolt per centimeter criterion.

In certain embodiments, layer 14 can provide a relatively high critical current, as measured in unites of Amperes per unit width. As an example, the critical current can be expressed in units of Amperes per centimeter width. Of course, layer 14 need not be one centimeter wide. Rather, this value can be used for convenience to normalize the current to width ratio value for materials having different widths. As an example, a sample that has a current of 100 Amperes and is 0.5 centimeter wide would have a critical current of 200 Amperes per centimeter width. A sample that provides a current of 200 Amperes and is one centimeter wide would also has a critical current of 200 Amperes per centimeter width. In preferred embodiments, layer 14 has a critical current of at least about 200 Amperes per centimeter of width (e.g., at least about 300 Amperes per centimeter of width, at least about 500 centimeters per centimeter of width).

For some superconductor materials, such as YBCO, the ability of the material to provide high transport current in its superconducting state depends upon the crystallographic orientation of the material. For example, such a material can exhibit a relatively high $J_c$ when the surface of the material is biaxially textured.

As used herein, "biaxially textured" refers to a surface for which the crystal grains are in close alignment with a direction in the plane of the surface. One type of biaxially textured surface is a cube textured surface, in which the crystal grains are also in close alignment with a direction perpendicular to the surface. Examples of cube textured surfaces include the (100)[001] and (100)[011] surfaces, and an example of a biaxially textured surface is the (113)[211] surface. Surface 13 of layer 12 can be prepared using vacuum processes, such as ion beam assisted deposition (IBAD), inclined substrate deposition and other vacuum techniques known in the art to form a biaxially textured surface on, for example, a randomly oriented polycrystalline surface.

The superconductor layer 14 can be an epitaxial layer. As used herein, "epitaxial layer" refers to a layer of material whose crystallographic orientation is directly related to (e.g., the same as) the crystallographic orientation of the surface of a layer of material onto which the epitaxial layer is deposited. For example, for an article having an epitaxial layer of superconductor material deposited onto a substrate, the crystallographic orientation of the layer of superconductor material is substantially the same as the crystallographic orientation of the substrate. Thus, in addition to the above-discussed properties of a substrate, it can be also desirable for a substrate to have a biaxially textured surface or a cube textured surface.

The biaxially textured surface or cube textured surface can be prepared, for example, by rolling and annealing. Surfaces can also be prepared using vacuum processes, such as ion beam assisted deposition, inclined substrate deposition and other vacuum techniques known in the art to form a biaxially textured surface on, for example, a randomly oriented polycrystalline surface. In certain embodiments (e.g., when ion beam assisted deposition is used), the surface of the substrate need not be textured (e.g., the surface can be randomly oriented polycrystalline, or the surface can be amorphous).

The substrate can be formed of any material capable of supporting a buffer layer stack and/or a layer of superconductor material. Examples of substrate materials that can be used as the substrate include for example, metals and/or alloys, such as nickel, silver, copper, zinc, aluminum, iron, chromium, vanadium, palladium, molybdenum and/or their alloys. In some embodiments, the substrate can be formed of a superalloy. In certain embodiments, the substrate can be in the form of an object having a relatively large surface area (e.g., a tape or a wafer). In these embodiments, the substrate is preferably formed of a relatively flexible material.

In some of these embodiments, the substrate can be a binary alloy that contains two of the following metals: copper, nickel, chromium, vanadium, aluminum, silver, iron, palladium, molybdenum, tungsten, gold and zinc. For example, a binary alloy can be formed of nickel and chromium (e.g., nickel and at most 20 atomic percent chromium, nickel and from about five to about 18 atomic percent chromium, or nickel and from about 10 to about 15 atomic percent chromium). As another example, a binary alloy can be formed of nickel and copper (e.g., copper and from about five to about 45 atomic percent nickel, copper and from about 10 to about 40 atomic percent nickel, or copper and from about 25 to about 35 atomic percent nickel). As a further example, a binary alloy can contain nickel and tungsten (e.g., from about one atomic percent tungsten to about 20 atomic percent tungsten, from about two atomic percent tungsten to about 10 atomic percent tungsten, from about three atomic percent tungsten to about seven atomic percent tungsten, about five atomic percent tungsten). A binary alloy can further include relatively small amounts of impurities (e.g., less than about 0.1 atomic percent of impurities, less than about 0.01 atomic percent of impurities, or less than about 0.005 atomic percent of impurities).

In certain embodiments, the substrate can contain more than two metals (e.g., a ternary alloy or a quarternary alloy). In some embodiments, the alloy can contain one or more oxide formers (e.g., Mg, Al, Ti, Cr, Ga, Ge, Zr, Hf, Y, Si, Pr, Eu, Gd, Tb, Dy, Ho, Lu, Th, Er, Tm, Be, Ce, Nd, Sm, Yb and/or La, with Al being the preferred oxide former), as well as two of the following metals: copper, nickel, chromium, vanadium, aluminum, silver, iron, palladium, molybdenum, gold and zinc. In certain of these embodiments, the alloy can contain two of the following metals: copper, nickel, chromium, vanadium, aluminum, silver, iron, palladium, molybdenum, gold and zinc, and can be substantially devoid of any of the aforementioned oxide formers.

In embodiments in which the alloys contain an oxide former, the alloys can contain at least about 0.5 atomic percent oxide former (e.g., at least about one atomic percent oxide former, or at least about two atomic percent oxide former) and at most about 25 atomic percent oxide former (e.g., at most about 10 atomic percent oxide former, or at most about four atomic percent oxide former). For example, the alloy can include an oxide former (e.g., at least about 0.5 aluminum), from about 25 atomic percent to about 55 atomic percent nickel (e.g., from about 35 atomic percent to about 55 atomic percent nickel, or from about 40 atomic percent to about 55 atomic percent nickel) with the balance being copper. As another example, the alloy can include an oxide former (e.g., at least about 0.5 atomic aluminum), from about five atomic percent to about 20 atomic percent chromium (e.g., from about 10 atomic percent to about 18 atomic percent chromium, or from about 10 atomic percent to about 15 atomic percent chromium) with the balance being nickel. The alloys can include relatively small amounts of additional metals (e.g., less than about 0.1 atomic percent of additional metals, less than about 0.01 atomic percent of additional metals, or less than about 0.005 atomic percent of additional metals).

A substrate formed of an alloy can be produced by, for example, combining the constituents in powder form, melting and cooling or, for example, by diffusing the powder constituents together in solid state. The alloy can then be formed by deformation texturing (e.g., annealing and rolling, swaging, extrusion and/or drawing) to form a textured surface (e.g., biaxially textured or cube textured). Alternatively, the alloy constituents can be stacked in a jelly roll configuration, and then deformation textured. In some embodiments, a material with a relatively low coefficient of thermal expansion (e.g., Nb, Mo, Ta, V, Cr, Zr, Pd, Sb, NbTi, an intermetallic such as NiAl or $Ni_3Al$, or mixtures thereof) can be formed into a rod and embedded into the alloy prior to deformation texturing.

In certain embodiments, the substrate can consist of a composite structure where the surface of the composite structure has a biaxially textured surface or cube textured surface and the core of the composite has a non-cube texture or a cube texture. In some of these embodiments, the biaxially textured surface or cube textured surface of the composite structure can a binary alloy that contains two of the following metals: copper, nickel, chromium, vanadium, aluminum, silver, iron, palladium, molybdenum, tungsten, gold and zinc. In some of these embodiments, the core material can contain a superalloy material, or a alloy material containing two or more of the following materials: copper, nickel, chromium, vanadium, aluminum, silver, iron, palladium, molybdenum, tungsten, gold and zinc.

In some embodiments, stable oxide formation at the surface can be mitigated until a first epitaxial (for example, buffer) layer is formed on the biaxially textured alloy surface, using an intermediate layer disposed on the surface of the substrate. Intermediate layers include those epitaxial metal or alloy layers that do not form surface oxides when exposed to conditions as established by $PO_2$ and temperature required for the initial growth of epitaxial buffer layer films. In addition, the buffer layer acts as a barrier to prevent substrate element(s) from migrating to the surface of the intermediate layer and forming oxides during the initial growth of the epitaxial layer. Absent such an intermediate layer, one or more elements in the substrate would be expected to form thermodynamically stable oxide(s) at the substrate surface which could significantly impede the deposition of epitaxial layers due to, for example, lack of texture in this oxide layer.

In some of these embodiments, the intermediate layer is transient in nature. "Transient," as used herein, refers to an intermediate layer that is wholly or partly incorporated into or with the biaxially textured substrate following the initial nucleation and growth of the epitaxial film. Even under these circumstances, the intermediate layer and biaxially textured substrate remain distinct until the epitaxial nature of the deposited film has been established. The use of transient intermediate layers may be preferred when the intermediate layer possesses some undesirable property, for example, the intermediate layer is magnetic, such as nickel.

Exemplary intermediate metal layers include nickel, gold, silver, palladium, and alloys thereof. Additional metals or alloys may include alloys of nickel and/or copper. Epitaxial films or layers deposited on an intermediate layer can include metal oxides, chalcogenides, halides, and nitrides. In some embodiments, the intermediate metal layer does not oxidize under epitaxial film deposition conditions.

Care should be taken that the deposited intermediate layer is not completely incorporated into or does not completely diffuse into the substrate before nucleation and growth of the initial buffer layer structure causes the epitaxial layer to be established. This means that after selecting the metal (or alloy) for proper attributes such as diffusion constant in the substrate alloy, thermodynamic stability against oxidation under practical epitaxial buffer layer growth conditions and lattice matching with the epitaxial layer, the thickness of the deposited metal layer has to be adapted to the epitaxial layer deposition conditions, in particular to temperature.

Deposition of the intermediate metal layer can be done in a vacuum process such as evaporation or sputtering, or by electro-chemical means such as electroplating (with or without electrodes). These deposited intermediate metal layers may or may not be epitaxial after deposition (depending on substrate temperature during deposition), but epitaxial orientation can subsequently be obtained during a post-deposition heat treatment.

In certain embodiments, sulfur can be formed on the surface of the intermediate layer. The sulfur can be formed on the surface of the intermediate layer, for example, by exposing the intermediate layer to a gas environment containing a source of sulfur (e.g., $H_2Sl$) and hydrogen (e.g., hydrogen, or a mix of hydrogen and an inert gas, such as a 5% hydrogen/argon gas mixture) for a period of time (e.g., from about 10 seconds to about one hour, from about one minute to about 30 minutes, from about five minutes to about 15 minutes). This can be performed at elevated temperature (e.g., at a temperature of from about 450° C. to about 1100° C., from about 600° C. to about 900° C., 850° C.). The pressure of the hydrogen (or hydrogen/inert gas mixture) can be relatively low (e.g., less than about one Torr, less than about $1 \times 10^{-3}$ Torr, less than about $1 \times 10^{-6}$ Torr) or relatively high (e.g., greater than about 1 Torr, greater than about 100 Torr, greater than about 760 Torr).

Without wishing to be bound by theory, it is believed that exposing the textured substrate surface to a source of sulfur under these conditions can result in the formation of a superstructure (e.g., a c(2×2) superstructure) of sulfur on the textured substrate surface. It is further believed that the superstructure can be effective in stabilizing (e.g., chemically and/or physically stabilizing) the surface of the intermediate layer.

While one approach to forming a sulfur superstructure has been described, other methods of forming such superstructures can also be used. For example, a sulfur superstructure (e.g., S c(2×2)) can be formed by applying an appropriate organic solution to the surface of the intermediate layer by heating to an appropriate temperature in an appropriate gas environment.

Moreover, while formation of a sulfur superstructure on the surface of the intermediate layer has been described, it is believed that other superstructures may also be effective in stabilizing (e.g., chemically and/or physically stabilizing) the surface. For example, it is believed that an oxygen superstructure, a nitrogen superstructure, a carbon superstructure, a potassium superstructure, a cesium superstructure, a lithium superstructure or a selenium superstructure disposed on the surface may be effective in enhancing the stability of the surface.

Some substrates do not readily exhibit all the above-noted features, so one or more intermediary layers, commonly referred to as buffer layers, can be disposed between the substrate and the superconductor layer. The buffer layer(s) can be more resistant to oxidation than the substrate, and reduce the diffusion of chemical species between the substrate and the superconductor layer. Moreover, the buffer layer(s) can have a coefficient of thermal expansion that is well matched with the superconductor material.

A buffer layer can be an epitaxial layer, so its crystallographic orientation is directly related to the crystallographic orientation of the surface onto which the buffer layer is deposited. For example, in an multi-layer article having a substrate, an epitaxial buffer layer and an epitaxial layer of superconductor material, the crystallographic orientation of the surface of the buffer layer is directly related to the crystallographic orientation of the surface of the substrate, and the crystallographic orientation of the layer of superconductor material is directly related to the crystallographic orientation of the surface of the buffer layer. Therefore, the superconducting properties exhibited by the article having a buffer layer can depend upon the crystallographic orientation of the buffer layer surface.

In some embodiments, similar to surface 13, a buffer layer can be formed using plasma vapor deposition. In this technique, a buffer layer material is deposited, for example, by reactive sputtering or pulsed laser deposition, on the biaxially textured or cube textured surface of the substrate.

For example the buffer layer can be formed by sputtering a material that that forms epitaxially (e.g., a material such as $Y_2O_3$, $CeO_2$, $Gd_2O_3$) on the substrate surface.

The conditions used during deposition of the buffer layer material can include, for example, a substrate temperature of from about 200° C. to about 1000° C. (e.g., from about 500 to about 900° C.), in a atmosphere containing $H_2O$ and $H_2$, the concentrations of $H_2O$ to $H_2$ should be set such that the buffer material forms an epitaxial layer on the substrate surface.

In some embodiments, a plurality of buffer layers can be deposited by epitaxial growth on the surface of the first buffer layer. In this technique, a buffer layer material is deposited, for example, by sputtering or pulsed laser deposition, on the biaxially textured or cube textured surface of the first buffer layer.

Examples of buffer layer materials include metal oxides, such as $TbO_x$, $GaO_x$, $CeO_2$, yttria-stabilized zirconia (YSZ), $Y_2O_3$, $LaAlO_3$, $SrTiO_3$, $Gd_2O_3$, $LaNiO_3$, $LaCuO_3$, $SrRuO_3$, $NdGaO_3$, $NdAlO_3$ and/or some nitrides as known to those skilled in the art.

A buffer material can be prepared using solution phase techniques, including metalorganic deposition, such as disclosed in, for example, S. S. Shoup et al., J. Am. Cer. Soc., vol. 81, 3019; D. Beach et al., Mat. Res. Soc. Symp. Proc., vol. 495, 263 (1988); M. Paranthaman et al., Superconductor Sci.

Tech., vol. 12, 319 (1999); D. J. Lee et al., Japanese J. Appl. Phys., vol. 38, L178 (1999) and M. W. Rupich et al., I.E.E.E. Trans. on Appl. Supercon. vol. 9, 1527. In certain embodiments, solution coating processes can be used for deposition of one or a combination of any of the oxide layers on textured substrates; however, they can be particularly applicable for deposition of the initial (seed) layer on a textured metal substrate. The role of the seed layer is to provide 1) protection of the substrate from oxidation during deposition of the next oxide layer when carried out in an oxidizing atmosphere relative to the substrate (for example, magnetron sputter deposition of yttria-stabilized zirconia from an oxide target); and 2) an epitaxial template for growth of subsequent oxide layers. In order to meet these requirements, the seed layer should grow epitaxially over the entire surface of the metal substrate and be free of any contaminants that may interfere with the deposition of subsequent epitaxial oxide layers.

The formation of oxide buffer layers can be carried out so as to promote wetting of an underlying substrate layer. Additionally, in particular embodiments, the formation of metal oxide layers can be carried out using metal alkoxide precursors (for example, "sol gel" precursors).

In some embodiments, similar to surface 13, a buffer layer can be formed using IBAD. In this technique, a buffer layer material is evaporated using, for example, electron beam evaporation, sputtering deposition, or pulsed laser deposition while an ion beam (e.g., an argon ion beam) is directed at a smooth amorphous surface of a substrate onto which the evaporated buffer layer material is deposited.

For example, the buffer layer can be formed by ion beam assisted deposition by evaporating a buffer layer material having a rock-salt like structure (e.g., a material having a rock salt structure, such as an oxide, including MgO, or a nitride) onto a smooth, amorphous surface (e.g., a surface having a root mean square roughness of less than about 100 Angstroms) of a substrate so that the buffer layer material has a surface with substantial alignment (e.g., about 13° or less), both in-plane and out-of-plane.

The conditions used during deposition of the buffer layer material can include, for example, a substrate temperature of from about 0° C. to about 400° C. (e.g., from about room temperature to about 400° C.), a deposition rate of from about 1.0 Angstrom per second to about 4.4 Angstroms per second, an ion energy of from about 200 eV to about 1200 eV, and/or an ion flux of from about 110 microamperes per square centimeter to about 120 microamperes per square centimeter.

In some embodiments, when using IBAD, the substrate is formed of a material having a polycrystalline, non-amorphous base structure (e.g., a metal alloy, such as a nickel alloy) with a smooth amorphous surface formed of a different material (e.g., $Si_3N_4$).

In certain embodiments, a plurality of buffer layers can be deposited by epitaxial growth on an original IBAD surface. Each buffer layer can have substantial alignment (e.g., about 13° or less), both in-plane and out-of-plane.

These methods are described in PCT Publication No. WO 99/25908, published on May 27, 1999, and entitled "Thin Films Having A Rock-Salt-Like Structure Deposited on Amorphous Surfaces."

In certain embodiments, the buffer can be conditioned (e.g., thermally conditioned and/or chemically conditioned) so that layer 14 is formed on a conditioned surface. The conditioned surface of the buffer layer can be biaxially textured (e.g., (113)[211]) or cube textured (e.g., (100)[011] or (100)[011]), have peaks in an X-ray diffraction pole figure that have a full width at half maximum of less than about 20° (e.g., less than about 15°, less than about 10°, or from about 5° to about 10°), be smoother than before conditioning as determined by high resolution scanning electron microscopy or atomic force microscopy, have a relatively high density, have a relatively low density of impurities, exhibit enhanced adhesion to other material layers (e.g., a superconductor layer or a buffer layer) and/or exhibit a relatively small rocking curve width as measured by x-ray diffraction.

"Chemical conditioning" as used herein refers to a process which uses one or more chemical species (e.g., gas phase chemical species and/or solution phase chemical species) to affect changes in the surface of a material layer, such as a buffer layer or a superconductor material layer, so that the resulting surface exhibits one or more of the above noted properties.

"Thermal conditioning" as used herein refers to a process which uses elevated temperature, with or without chemical conditioning, to affect changes in the surface of a material layer, such as a buffer layer or a superconductor material layer, so that the resulting surface exhibits one or more of the above noted properties. Thermal conditioning can be performed with or without the use of chemical conditioning. Preferably, thermal conditioning occurs in a controlled environment (e.g., controlled gas pressure, controlled gas environment and/or controlled temperature).

Thermal conditioning can include heating the surface of the buffer layer to a temperature at least about 5° C. above the deposition temperature or the crystallization temperature of the underlying layer (e.g., from about 15° C. to about 500° C. above the deposition temperature or the crystallization temperature of the underlying layer, from about 75° C. to about 300° C. above the deposition temperature or the crystallization temperature of the underlying layer, or from about 150° C. to about 300° C. above the deposition temperature or the crystallization temperature of the underlying layer). Examples of such temperatures are from about 500° C. to about 1200° C. (e.g., from about 800° C. to about 1050° C.). Thermal conditioning can be performed under a variety of pressure conditions, such as above atmospheric pressure, below atmospheric pressure, or at atmospheric pressure. Thermal conditioning can also be performed using a variety of gas environments, such as a chemical conditioning environment (e.g., an oxidizing gas environment, a reducing gas environment) or an inert gas environment.

"Deposition temperature" as used herein refers to the temperature at which the layer being conditioned was deposited.

"Crystallization temperature" as used herein refers to the temperature at which a layer of material (e.g., the underlying layer) takes on a crystalline form.

Chemical conditioning can include vacuum techniques (e.g., reactive ion etching, plasma etching and/or etching with fluorine compounds, such as $BF_3$ and/or $CF_4$). Chemical conditioning techniques are disclosed, for example, in *Silicon Processing for the VLSI Era*, Vol. 1, eds. S. Wolf and R. N. Tanber, pp. 539-574, Lattice Press, Sunset Park, Calif., 1986.

Alternatively or additionally, chemical conditioning can involve solution phase techniques, such as disclosed in *Metallurgy and Metallurgical Engineering Series,* 3d ed., George L. Kehl, McGraw-Hill, 1949. Such techniques can include contacting the surface of the underlying layer with a relatively mild acid solution (e.g., an acid solution containing less about 10 percent acid, less than about two percent acid, or less than about one percent acid). Examples of mild acid solutions include perchloric acid, nitric acid, hydrofluoric acid, hydrochloric acid, acetic acid and buffered acid solutions. In one embodiment, the mild acid solution is about one percent aqueous nitric acid. In certain embodiments, bromide-containing and/or bromine-containing compositions (e.g., a liquid bromine solution) can be used to condition the surface of a buffer layer or a superconductor layer.

These methods are described in commonly owned U.S. Provisional Patent Application No. 60/166,140, filed Nov. 18, 1999, and entitled "Multi-Layer Articles and Methods of Making Same," and commonly owned U.S. Pat. No. 6,974, 501.

While the foregoing discussion has described articles having one thick layer of superconductor material (i.e., no intermediary layer), the invention is not limited in this sense. Instead, one or more superconductor layers can be used. More details are provided in U.S. Pat. Nos. 6,562,761 and 6,669, 774.

In some embodiments, a superconductor article includes three buffer layers between the substrate and superconductor material. A layer of $Y_2O_3$ or $CeO_2$ (e.g., from about 50 nanometers to about 100 nanometers thick) is deposited (e.g., using electron beam evaporation) onto the substrate surface, or a layer of $Gd_2O_3$ is deposited from solution. A layer of YSZ (e.g., from about 50 nanometers to about 100 nanometers thick, such as about 75 nanometers thick) is deposited onto the surface of the $Y_2O_3$, $CeO_2$ or $Gd_2O_3$ layer using sputtering (e.g, using magnetron sputtering). A $CeO_2$ layer (e.g., about 50 nanometers to about 100 nanometers thick) is deposited (e.g., using magnetron sputtering) onto the YSZ surface, or a layer of $Gd_2O_3$ is deposited from solution onto the YSZ surface. One or more of the buffer layers can be chemically and/or thermally conditioned as described herein.

Superconductor articles according to the invention can also include a layer of a cap material which can be formed of a metal or alloy whose reaction products with the superconductor material (e.g., $YBa_2Cu_3O_{7-x}$) are thermodynamically unstable under the reaction conditions used to form the layer of cap material. Exemplary cap materials include silver, gold, palladium and platinum.

In addition, while the foregoing discussion has described multi-layer articles having certain structures, the invention is not limited in this sense. For example, in some embodiments, multi-layer high temperature superconductors are provided, including first and second high temperature superconductor coated elements. Each element includes a substrate, at least one buffer layer deposited on the substrate, a high temperature superconductor layer, and optionally a cap layer. The first and second high temperature superconductor coated elements can be joined at the first and second cap layers, or can be joined with an intervening, preferably metallic, layer. Exemplary joining techniques include soldering and diffusion bonding.

Such a multi-layer architecture can provide improved current sharing, lower hysteretic losses under alternating current conditions, enhanced electrical and thermal stability, and improved mechanical properties. Useful conductors can be made having multiple tapes stacked relative to one another and/or laminated to provide sufficient ampacity, dimensional stability, and mechanical strength. Such embodiments also provide a means for splicing coated tape segments and for termination of coated tape stackups or conductor elements.

Moreover, it is expected that this architecture can provide significant benefits for alternating current applications. AC losses are shown to be inversely proportional to the effective critical current density within the conductor, more specifically, the cross-sectional area within which the current is carried. For a multifilimentary conductor, this would be the area of the "bundle" of superconducting filaments, excluding any sheath material around that bundle. For a "face-to-face" architecture, the "bundle" critical current density would encompass only the high temperature superconductor films and the thickness of the cap layer structure. The cap layer can be formed of one or more layers, and preferably includes at least one noble metal layer. "Noble metal," as used herein, is a metal, the reaction products of which are thermodynamically unstable under the reaction conditions employed to prepare the HTS tape. Exemplary noble metals include, for example, silver, gold, palladium, and platinum. Noble metals provide a low interfacial resistance between the HTS layer and the cap layer. In addition, the cap layer can include a second layer of normal metal (for example, copper or aluminum or alloys of normal metals). In direct current applications, additional face-to-face wires would be bundled or stacked to provide for the required ampacity and geometry for a given application.

Additionally, the high temperature superconductor film on the surface of the tapes could be treated to produce local breaks, that is, non-superconducting regions or stripes in the film only along the length of the tape (in the current flow direction). The cap layer deposited on the high temperature superconductor film would then serve to bridge the nonsuperconducting zones with a ductile normal metal region. An offset in the edge justification of the narrow strips or filaments, similar to a running bond brick pattern, would allow current to transfer to several narrow superconducting filaments both across the cap layers and to adjacent filaments, further increasing the redundancy and improving stability.

In all embodiments, a normal metal layer could be included along the edge of the conductor to hermetically seal the high temperature superconductor films and to provide for current transfer into the film, and if necessary, from the film into the substrate.

More details are provided in commonly owned U.S. Provisional Patent Application Ser. No. 60/145,468, filed on Jul. 23, 1999, and entitled "Enhanced High Temperature Coated Superconductors," and U.S. Pat. No. 6,828,507.

In some embodiments, coated conductors can be fabricated in a way that minimizes losses incurred in alternating current applications. The conductors are fabricated with multiple conducting paths, each of which comprises path segments which extend across at least two conducting layers, and further extend between these layers.

Each superconducting layer has a plurality of conductive path segments extending across the width of the layer, from one edge to another, and the path segments also have a component of direction along the length of the superconducting layer. The path segments in the superconducting layer surface are in electrically conductive communication with interlayer connections, which serve to allow current to flow from one superconducting layer to another. Paths, which are made up of path segments, are periodically designed, so that current flow generally alternates between two superconducting layers in bilayered embodiments, and traverses the layers through interlayer connections.

Superconducting layers can be constructed to contain a plurality of path segments which extend both across their widths and along their lengths. For example, superconducting layers can be patterned so as to achieve a high resistivity or a fully insulating barrier between each of the plurality of path segments. For example, a regular periodic array of diagonal path segments can be imposed on the layer along the full length of the tape. Patterning of superconducting layers to give such arrays can be accomplished by a variety of means known to those skilled in the art, including for example, laser scribing, mechanical cutting, implantation, localized chemical treatment through a mask, and other known methods. Further, the superconducting layers are adapted to allow the conductive path segments in their surfaces to electrically communicate with conducting interlayer connections passing between the layers, at or near their edges. The interlayer connections will typically be normally conducting (not superconducting) but in special configurations could also be superconducting. Interlayer connections provide electrical communication between superconducting layers which are separated by non-conducting or highly resistive material which is positioned between the superconducting layers. Such non-conducting or highly resistive material can be deposited on one superconducting layer. Passages can be fabricated at the edges of the insulating material to allow the introduction of interlayer connections, followed by deposition of a further superconducting layer. One can achieve a transposed configuration with coated conductors by patterning a superconducting layer into filaments parallel to the axis of the tape and winding the tape in a helical fashion around a cylindrical form.

Without further elaboration, it is believed that the above description has adequately enabled the present invention. The following examples are, therefore, to be construed as merely illustrative, and not limitative of the remainder of the disclosure in any way whatsoever. All of the publications cited herein are hereby incorporated by reference in their entirety.

Example 1

A precursor solution was prepared as follows. 6.0 grams of $Y(CF_3CO_2)_3$, 10.2 grams of $Ba(CF_3CO_2)_2$, 2.5 grams of $Dy(O_2CCH_3)_3$, and 9.5 grams of $Cu(CH_3CH_2CO_2)_2$ were dissolved in 45 milliliters of $CH_3OH$ and 1.5 milliliters of $HO_2CCH_2CH_3$.

The precursor solution was deposited onto a continuous length of a metal tape substrate using a slot die coater.

The metal tape substrate was formed of four layers. The first layer was deformation textured nickel tungsten (5 at %) alloy having a thickness of about 75 micrometers and a width of about 46 millimeters. An about 75 nanometer thick epitaxial layer of $Y_2O_3$ was disposed on the textured surface of the nickel tungsten. An epitaxial layer of YSZ (about 75 nanometer thick) was disposed on the $Y_2O_3$ layer. An epitaxial layer of $CeO_2$ layer (about 75 nanometer thick) was disposed on the YSZ layer.

The precursor film was deposited in an atmosphere containing about 11 torr $H_2O$ and the balance nitrogen (total pressure of about 760 torr). The coating weight was equivalent to a $Y_{(1-x)}Dy_xBa_2Cu_3O_{(7-d)}$ thickness of about 1.2 μm.

Figure 2:
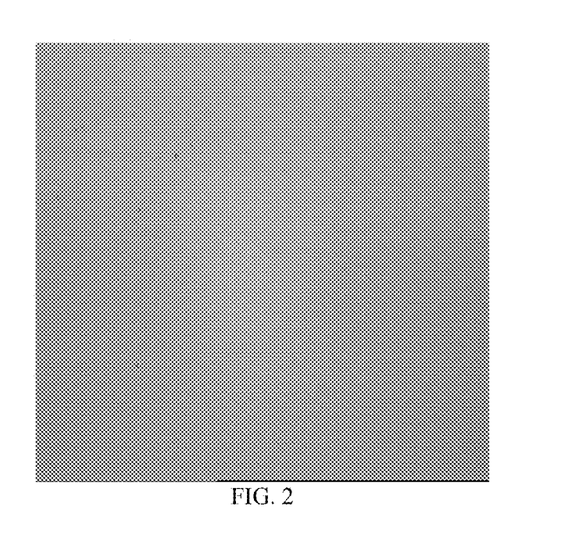
FIG. 2 is an optical micrograph of a defect-free metal-oxyfluoride intermediate film formed by the method of this invention (25× magnification).

The precursor coated film was decomposed by transporting the coated substrate through a tube furnace which had temperature and gas environment gradients. The sample was transported at an appropriate rate to provide a residence time of 1.5 hr in the temperature range of 100-250° C. in a nominal gas environment having a total gas pressure of about 760 Torr (water vapor pressure of about 25 Torr) and a residence time of 0.5 hr in the temperature range of 250 C-400° C. in a nominal gas environment having a total pressure of about 760 Torr (water vapor pressure of about 32 Torr). The thickness of the intermediate film was about 3.7 micrometers as measured by SEM cross-section analysis. FIG. 2 is an optical micrograph of the film (25× magnification), showing that the film has no visible cracks or blisters.

Figure 3:
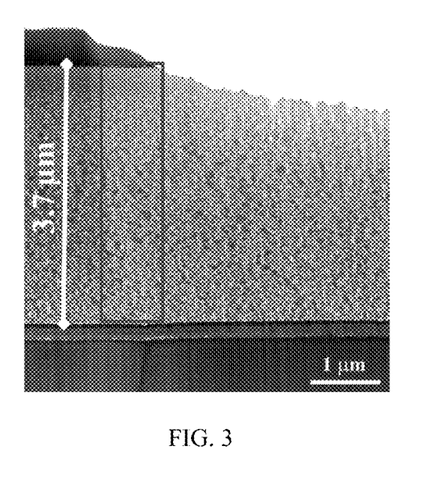
FIG. 3 is an SEM micrograph a defect-free metal-oxyfluoride intermediate film formed by the method of this invention.
Figure 4:
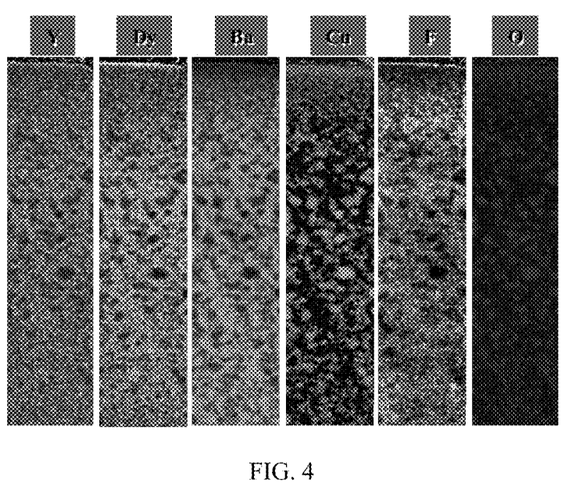
FIG. 4 includes EDS spectra of the cross section of the single-layer intermediate film shown in FIG. 3.

Energy Dispersive X-ray spectra (FIG. 4) of the cross-section area of the intermediate film as indicated by the rectangular box in the SEM micrograph (FIG. 3) shows a uniform distribution of each constituting element through the thickness with no disruptive composition transitions in the middle of the film.

The intermediate film thus obtained was heated to about 785° C. at a rate of about 100° C. per minute and held for about 12 minutes in an environment having a nominal total gas pressure of about 475 millitorr (water vapor pressure of about 250 millitorr, oxygen gas pressure of about 225 millitorr) followed by holding at 785° C. for about 12 minutes in the same gas environment before cooling to room temperature. The film was subsequently heated to a temperature of about 550° C. and held at this temperature for about 0.5 hr in a gas environment having a nominal total gas pressure of 760 Torr (about 760 Torr oxygen) and subsequently cooled to room temperature.

The resulting layer was (001) textured $Y_{(1-x)}Dy_xBa_2Cu_3O_{(7-d)}$ superconductor with a thickness of about 1.2 micrometers based on mass. The superconductor film had a critical current density of 3 $MA/cm^2$.

Example 2

Figure 5:
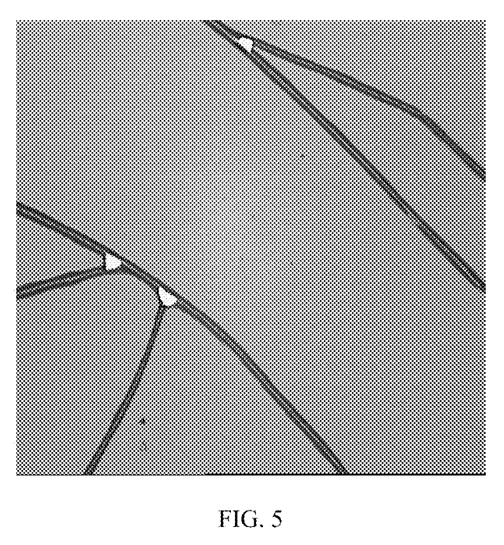
FIG. 5 is an optical micrograph of a crack-containing metal-oxyfluoride intermediate film formed in a control experiment (25× magnification).

A film of an intermediate was formed in a manner similar to that described in Example 1 except that it was processed with a single gas composition (water vapor pressure of 15 Torr). The thickness of the intermediate film was about 3 micrometers measured by SEM cross-section analysis. FIG. 5 is an optical micrograph of the film (25× magnification) showing that the film contained many visible cracks.

Example 3

Figure 6:
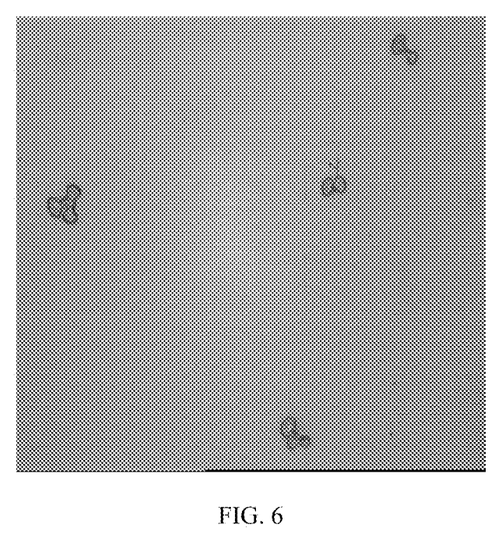
FIG. 6 is an optical micrograph of a blister-containing metal-oxyfluoride intermediate film formed in a control experiment (25× magnification).

A film of an intermediate was formed in a manner similar to that described in Example 1 except that it was processed with a single gas composition (water vapor pressure of 28 Torr). FIG. 6 is an optical micrograph of the film (25× magnification) showing that the film contained many visible blister-like defects.

Example 4

A precursor solution, as described in Example 1, was used to deposit a precursor film on a substrate as described in Example. The film was deposited by slot die coating and had a thickness equivalent to 0.8 μm $Y_{(1-x)}Dy_xBa_2Cu_3O_{(7-d)}$.

The precursor coated film was decomposed by transporting the coated substrate through a tube furnace which had temperature and gas environment gradients. The sample was transported at an appropriate rate to provide a residence time of 1.6 hr in the temperature range of 100-250° C. in a nominal gas environment having a total gas pressure of about 760 Torr (water vapor pressure of about 18 Torr) and a residence time of 0.7 hr in the temperature range of 250° C.-400° C. in a nominal gas environment having a total pressure of about 760 Torr (water vapor pressure of about 18 Torr).

A second layer of the precursor film, equivalent to 0.6 μm $Y_{(1-x)}Dy_xBa_2Cu_3O_{(7-d)}$ was deposited on the intermediate film by slot-die coating.

The second precursor film was decomposed by transporting the coated substrate through a tube furnace which had temperature and gas environment gradients. The sample was transported at an appropriate rate to provide a residence time of 1.6 hr in the temperature range of 100-250° C. in a nominal gas environment having a total gas pressure of about 760 Torr (water vapor pressure of about 13 Torr) and a residence time of 0.7 hr in the temperature range of 250° C.-400° C. in a nominal gas environment having a total pressure of about 760 Torr (water vapor pressure of about 13 Torr).

Figure 7:
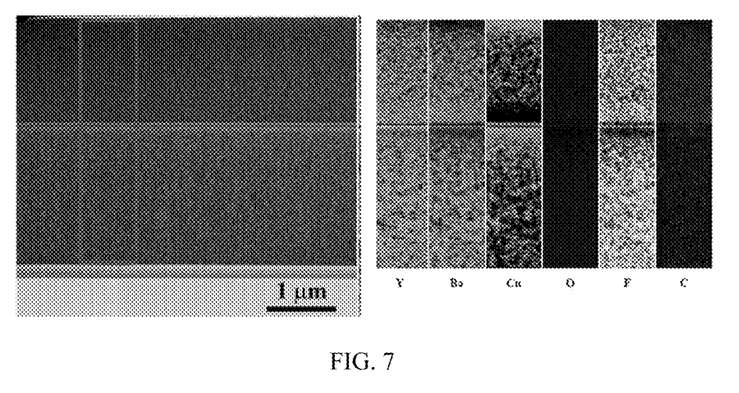
FIG. 7 includes an SEM micrograph (left) and EDS spectra (right) of the cross section of a two-layer intermediate film formed in a control experiment.

As shown in FIG. 7 (left: SEM micrograph of the cross section; right: EDS spectra of the cross section), the intermediate film had a non-uniform distributions of the constituting elements through the thickness with an interruptive interface between the individual layers in the middle of the film.

Other Embodiments

All of the features disclosed in this specification may be combined in any combination. Each feature disclosed in this specification may be replaced by an alternative feature serving the same, equivalent, or similar purpose. For instance, a thick HTS film may be prepared from a precursor solution containing only one or no metal salt being trifluoroacetate. Thus, unless expressly stated otherwise, each feature disclosed is only an example of a generic series of equivalent or similar features. From the above description, one skilled in the art can easily ascertain the essential characteristics of the present invention, and without departing from the spirit and scope thereof, can make various changes and modifications of the invention to adapt it to various usages and conditions. Thus, other embodiments are also within the scope of the following claims.

What is claimed is:

1. An article comprising:
   a substrate, and
   a layer of a homogeneous metal-oxyfluoride intermediate film disposed on the substrate, the intermediate film containing a rare earth metal, an alkaline earth metal, and a transition metal,
   wherein the intermediate film has a defect density less than 20 percent and, upon thermal treatment, is capable of converting to a homogeneous rare earth metal-alkaline earth metal-transition metal-oxide superconductor film with a stoichiometric thickness greater than 1 μm and up to 5 μm.

2. The article of claim 1, wherein the layer of the intermediate film a single layer.

3. The article of claim 1, wherein the intermediate film is, upon thermal treatment, capable of converting to a rare earth metal-alkaline earth metal-transition metal-oxide superconductor film with a stoichiometric thickness between 1.2 μm and 3 μm.

4. The article of claim 1, wherein the intermediate film is, upon thermal treatment, capable of converting to a rare earth metal-alkaline earth metal-transition metal-oxide superconductor film having critical current density of 1 to 5 $MA/cm^2$.

5. The article of claim 4, wherein the intermediate film is, upon thermal treatment, capable of converting to a rare earth metal-alkaline earth metal-transition metal-oxide superconductor film having critical current density of 2.5 to 5 $MA/cm^2$.

6. The article of claim 1, wherein the intermediate film further contains a second rare earth or transition metal which, upon thermal treatment of the intermediate film to form the superconductor film, is capable of forming a plurality of pinning centers dispersed within the superconductor film, the pinning centers being nanoparticles formed of the second rare earth metal.

7. The article of claim 1, wherein the intermediate film is, upon thermal treatment, capable of converting to an YBCO film.

8. The article of claim 1, wherein the intermediate film has a defect density less than 10 percent.

9. The article of claim 1, wherein intermediate film has a defect density less than 5 percent.

10. The article of claim 1, wherein intermediate film has a defect size less than 500 μm.

11. The article of claim 1, wherein intermediate film has a defect size less than 100 μm.

12. The article of claim 1, wherein the substrate is metallic.

13. The article of claim 1, further comprising a buffer layer between the substrate and the layer of the intermediate film.

14. An article comprising:
   a substrate, and
   a homogeneous film disposed on the substrate,
   wherein the film, formed of a rare earth metal-alkaline earth metal-transition metal-oxide superconductor, has a laminar grain structure, a stoichiometric thickness greater than 1 μm and up to 5 μm, a porosity of 5%-20%, and a critical current density of 1 to 5 $MA/cm^2$.

* * * * *